(12) United States Patent
Gaury

(10) Patent No.: US 12,422,757 B2
(45) Date of Patent: Sep. 23, 2025

(54) MARK TO BE PROJECTED ON AN OBJECT DURING A LITHOGRAPHIC PROCESS AND METHOD FOR DESIGNING A MARK

(71) Applicant: ASML Netherlands B.V., Veldhoven (NL)

(72) Inventor: Benoit Herve Gaury, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 167 days.

(21) Appl. No.: 18/123,224

(22) Filed: Mar. 17, 2023

(65) Prior Publication Data
US 2023/0229093 A1 Jul. 20, 2023

Related U.S. Application Data

(63) Continuation of application No. PCT/EP2021/074185, filed on Sep. 1, 2021.

(30) Foreign Application Priority Data

Sep. 17, 2020 (EP) .................................. 20196782

(51) Int. Cl.
*G03F 7/00* (2006.01)
(52) U.S. Cl.
CPC ...... *G03F 7/70633* (2013.01); *G03F 7/70683* (2013.01); *G03F 7/70741* (2013.01)
(58) Field of Classification Search
CPC ............. G03F 7/70633; G03F 7/70683; G03F 7/70741; G03F 7/70658; G03F 7/70616; H01L 22/20; H01L 22/12
See application file for complete search history.

(56) References Cited

U.S. PATENT DOCUMENTS 5,617,340 A 4/1997 Cresswell et al.
7,068,833 B1 * 6/2006 Ghinovker ............ G03F 9/7076
382/145

(Continued)

FOREIGN PATENT DOCUMENTS

CN 102376601 B 5/2013
TW 449784 B 8/2001

(Continued)

OTHER PUBLICATIONS

International Search Report issued in related Foreign Application No. PCT/EP2021/074185; mailed Dec. 12, 2021 (2 pgs.).

(Continued)

*Primary Examiner* — Hung V Nguyen
(74) *Attorney, Agent, or Firm* — FINNEGAN, HENDERSON, FARABOW, GARRETT & DUNNER LLP

(57) ABSTRACT

A non-transitory computer-readable medium stores a set of instructions for performing operations to design a mark for assessing a lithographic process. The operations include determining an overlay step that represents a difference between different overlay distances of the different overlay configurations for a design of the mark. The mark includes a first layer mark with first layer components and a second layer mark with second layer components. The first layer mark and the second layer mark are to be projected onto each other via the lithographic process. Each overlay configuration has different overlay distance at which each first layer component is arranged in a first direction of an associated second layer component of the second layer components. The operations include determining a largest overlay distance. The operations also include determining a number of first layer components and/or a number of asso- (Continued)

ciated second layer components in each overlay configuration.

16 Claims, 7 Drawing Sheets

(56) References Cited

U.S. PATENT DOCUMENTS

| | | | |
|---|---|---|---|
| 9,786,569 B1 * | 10/2017 | Ho | H01L 22/20 |
| 9,798,250 B2 * | 10/2017 | Van De Kerkhof | G03F 7/70633 |
| 2007/0096094 A1 | 5/2007 | Levinski et al. | |

FOREIGN PATENT DOCUMENTS

| | | | |
|---|---|---|---|
| TW | I688025 B | 3/2020 | |
| WO | WO 2019/115391 A1 | 6/2019 | |

OTHER PUBLICATIONS

Office Action of the Intellectual Property Office of Taiwan issued in related Taiwanese Patent Application No. 110134569; mailed Jul. 6, 2022 (10 pgs.).

\* cited by examiner

MARK TO BE PROJECTED ON AN OBJECT DURING A LITHOGRAPHIC PROCESS AND METHOD FOR DESIGNING A MARK

CROSS-REFERENCE TO RELATED APPLICATIONS

This application claims priority of International application PCT/EP2021/074185, filed on 1 Sep. 2021, which claims priority of EP application 20196782.5, filed on 17 Sep. 2020. These application are incorporated herein by reference in their entireties.

FIELD

The embodiments of the present disclosure relate to the field of lithographic processes, in particular to a mark that is adapted to be projected on an object during a lithographic process and a method for designing such mark.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

By projecting different patterns onto the substrate, different layers can be generated on the substrate. Each layer may e.g. include a mark pattern. Mark patterns of consecutive layers can be constructed to have particular designed relative positions that can be inspected in order to assess the quality of the projection process. As an example, a first pattern can be projected onto the substrate together with a first layer mark followed by the projection of a second pattern together with a second layer mark. The combination of the first layer mark and the second layer mark may be considered a mark that can be inspected. The mark thus comprises a first layer mark e.g. comprising first layer components and a second layer mark e.g. comprising second layer components. The first layer components and the second layer components are arranged in a plurality of different overlay configurations and are adapted to form a conductive path based on their relative positions. Based on how many conductive paths are formed, information can be obtained from the mark, e.g. by determining a yield curve, which may e.g. be used to determine overlay or edge roughness.

SUMMARY

It is an object of at least some of the embodiments of the present disclosure to provide a more efficient design of the mark, such that the mark occupies less space and/or provides a higher precision The object is achieved with a computer readable medium, comprising instructions adapted to, when executed on a processing unit, make the processing unit perform a method for designing a mark adapted to be projected onto an object during a lithographic process. The method may according to any of the embodiments explained below.

The object is also achieved with a method for designing a mark adapted to be projected onto an object during a lithographic process. The mark comprises a first layer mark having a plurality first layer components, and a second layer mark having a plurality second layer components. The first layer mark and the second layer mark are adapted to be projected onto each other during the lithographic process. The first layer components and the second layer components are adapted to be arranged in a plurality of different overlay configurations, each overlay configuration comprising a number of the plurality of the first layer components and a number of the plurality of the second layer components, and each overlay configuration having a different overlay distance at which each first layer component is arranged in a first direction of an associated second layer component of the second layer components. The method comprises the following steps: determining an overlay step which represents a difference between the different overlay distances of the plurality of overlay configurations; determining a largest overlay distance and determining the number of first layer components and/or the number of associated second layer components in each overlay configuration. The object on which the mark is adapted to be projected may e.g. be a wafer or a substrate.

With the method according to some embodiments, the mark is advantageously designed. In particular, the space occupied on the object can be limited by designing an advantageous mark, while at the same time allowing to determine the yield curve with high precision. The yield curve may e.g. be used to determine overlay, material roughness of the first layer components and second layer components, a process window, a variation of critical dimensions of the first layer components and/or second layer components.

In some embodiments, the step of determining the overlay step includes a step of determining a yield curve representing a theoretical steepest yield curve situation. The yield curve represents, for each overlay configuration and in function of the overlay distance, the percentage of second layer components of said overlay configuration which form a conductive path with the first layer component of said overlay configuration it is associated with. The yield curve comprises at least a first lower level, a first higher level, and a first slope between the first lower level and the first higher level. The theoretical steepest yield curve situation corresponds with the situation in which the first slope is the steepest. The step of determining the overlay step further includes determining the overlay step such that, in theoretical steepest yield curve situation, the number of overlay configurations on the first slope is above a slope threshold. By taking into account the theoretical steepest yield curve situation, it can advantageously be ensured that the yield curve can be determined precisely in practice. At least de first slope of the yield curve can be determined precisely in all situations in which the mark is adapted to be applied.

In embodiments, the theoretical steepest yield curve situation is determined in function of the possible materials of the first layer components and/or second layer components. For example, the theoretical steepest yield curve situation may be the situation wherein the second layer components and/or the first layer components have the smallest roughness and/or the largest correlation length. Advantageously, it can be ensured that for all possible materials for which the mark is adapted to be applied, the yield curve can be determined precisely.

In embodiments, the step of determining the largest overlay distance includes determining a yield curve representing a theoretical softest yield curve situation. The yield curve represents, for each overlay configuration and in function of the overlay distance, the percentage of second layer components of said overlay configuration which form a conductive path with the first layer component of said overlay configuration it is associated with. The yield curve comprises at least a first lower level, a first higher level, and a first slope between the first lower level and the first higher level. The theoretical softest yield curve situation corresponds with the situation in which the first slope is the least steep. The step of determining the largest overlay distance further includes: determining a largest slope overlay distance in the theoretical softest yield curve situation, wherein the largest slope overlay distance corresponds with the largest overlay distance on the first slope and determining the largest overlay distance based on the largest slope overlay distance and a capture range deviation. Advantageously, it is ensured that the yield curve can be determined precisely when the second layer mark is shifted relative to the first layer mark within the capture range deviation. It is noted that in the context of this disclosure, if the overlay distance may be negative, terms as "largest" and "smallest" overlay distance reflect the absolute value of the overlay distance.

In embodiments, the method further comprises a step of determining a smallest overlay distance. Optionally, the absolute value of smallest overlay distance is larger than zero. Advantageously, the number of overlay configurations can be limited, thereby reducing the space on the object occupied by the mark.

In embodiments, the step of determining the smallest overlay distance includes determining a yield curve representing a theoretical softest yield curve situation. The yield curve represents, for each overlay configuration and in function of the overlay distance, the percentage of second layer components of said overlay configuration which form a conductive path with the first layer component of said overlay configuration it is associated with. The yield curve comprises at least a first lower level, a first higher level, and a first slope between the first lower level and the first higher level. The theoretical softest yield curve situation corresponds with the situation in which the first slope is the least steep. The step of determining the smallest overlay distance further includes: determining a smallest slope overlay distance in the theoretical softest yield curve situation, wherein the smallest slope overlay distance corresponds with the smallest overlay distance on the first slope, and determining the smallest overlay distance based on the smallest slope overlay distance and a capture range deviation. Advantageously, it is ensured that the yield curve can be determined precisely when the second layer mark is shifted relative to the first layer mark within the capture range deviation.

In embodiments, the theoretical softest yield curve situation is determined in function of the possible materials of the first layer components and/or second layer components. For example, the theoretical softest yield curve situation may be the situation wherein the second layer components and/or the first layer components have the largest roughness and/or the smallest correlation length. Advantageously, it can be ensured that for all possible materials for which the mark is adapted to be applied, the yield curve can be determined precisely.

In embodiments, the number of first layer components and the number of associated second layer components in each overlay configuration are determined in function of a desired precision. Advantageously, it is ensured that the desired precision can be met when determining the yield curve, while preferably limiting the number of first layer components and the number of associated second layer components.

The present disclosure further relates to a mark design, a mark, a reticle arrangement, and an apparatus. The mark may be designed according to the method described herein, but is not limited thereto. Features and definitions will have the same meaning with respect to the mark design, mark, reticle arrangement, and apparatus as they do with respect to the methods. Features, embodiments, and/or advantages explained with reference to the methods may equally be applied to the mark design, mark, reticle arrangement, and/or apparatus, and vice versa.

The present disclosure further relates to a mark design, wherein the mark design is designed according to the method described herein. Advantageously, the mark is designed efficiently and only occupies relatively little space of the pattern and on the object.

The present disclosure further relates to mark adapted to be projected onto an object during a lithographic process. The mark comprises a first layer mark having a plurality first layer components, and a second layer mark having a plurality second layer components. The first layer mark and the second layer mark are adapted to be projected onto each other during the lithographic process. The first layer components and the second layer components are adapted to be arranged in a plurality of different overlay configurations, each overlay configuration comprising a number of the plurality of the first layer components and a number of the plurality of the second layer components, and each overlay configuration having a different overlay distance at which each first layer component is arranged in a first direction of an associated second layer component of the second layer components. The overlay distances are between a smallest overlay distance and a largest overlay distance, and differ between the plurality of overlay configurations by an overlay step. Optionally, the smallest overlay distance is larger than zero. Advantageously, the space occupied by the second layer mark on the object can be limited, while the yield curve can be determined precisely.

In embodiments, the mark is adapted to be arranged on the object in a theoretical steepest yield curve situation, wherein the overlay step is such that the number of overlay configurations on a first slope of a yield curve in theoretical steepest yield curve situation is above a slope threshold. By taking into account the theoretical steepest yield curve situation, it can advantageously be ensured that the yield curve can be determined precisely in practice. At least de first slope of the yield curve can be determined precisely in all situations in which the mark is adapted to be applied.

In embodiments, the mark is adapted to be arranged on the object in a theoretical softest yield curve situation, wherein the largest overlay distance corresponds with a combination of a largest slope overlay distance in the theoretical softest yield curve situation and a capture range deviation. Advantageously, it is ensured that the yield curve can be determined precisely when the second layer mark is shifted relative to the first layer mark within the capture range deviation.

In embodiments, the mark is adapted to be arranged on the object in a theoretical softest yield curve situation, wherein the smallest overlay distance corresponds with a combination of a smallest slope overlay distance in the theoretical softest yield curve situation and a capture range deviation. Advantageously, it is ensured that the yield curve can be determined precisely when the second layer mark is shifted relative to the first layer mark within the capture range deviation.

In embodiments, the number of first layer components and the number of associated second layer components in each overlay configuration are adapted to obtain a desired precision. Advantageously, it is ensured that the desired precision can be met when determining the yield curve, while preferably limiting the number of second layer components and the number of first layer components.

The present disclosure further relates to an object comprising a mark. Advantageously, the mark occupies little space on the object.

The present disclosure further relates to a method for projecting a pattern on an object during a lithographic process, wherein the method comprises projecting a mark onto the object, wherein the mark is a mark described herein and/or wherein the mark designed according to the method described herein. Advantageously, the mark only occupies relatively little space of the pattern and on the object.

The present disclosure further relates to a method for inspecting an object, wherein the object comprises a mark, wherein the mark is a mark described herein and/or wherein the mark designed according to the method described herein. The method for inspecting comprises the following steps: projecting an electron beam onto the mark; determining voltage contrast responses for the second layer components; determining a yield curve based on the voltage contrast responses, wherein the yield curve represents, for each overlay configuration and in function of the overlay distance, the percentage of second layer components of said overlay configuration which form a conductive path with the first layer component of said overlay configuration it is associated with. Advantageously, the yield curve can be determined precisely using the mark.

The present disclosure further relates to a reticle arrangement comprising one or more reticles, wherein the reticles comprise patterns adapted to be projected onto an object during a lithographic process, wherein the patterns comprise a mark pattern for projecting a mark onto the object. The mark is a mark described herein and/or the mark is designed according to the method described herein. Advantageously, the mark occupies little space on the reticles and little space of the patterns on the reticles.

The present disclosure further relates to an apparatus comprising a processing unit, wherein the processing unit is adapted to perform the method described herein. Advantageously, the apparatus can be used to determine an advantageous mark.

The present disclosure further relates to a computer program product, comprising instructions adapted to, when executed on a processing unit, make the processing unit perform the method described herein. Advantageously, the computer program product can be used to determine an advantageous mark.

BRIEF DESCRIPTION OF THE DRAWINGS

Embodiments of the present disclosure will now be described, by way of example only, with reference to the accompanying schematic drawings, in which the same reference numbers indicate the same or similar features. In the drawings:

FIG. 5b illustrates possible responses during inspection of the mark shown in FIG. 5a;

DETAILED DESCRIPTION

Figure 1:
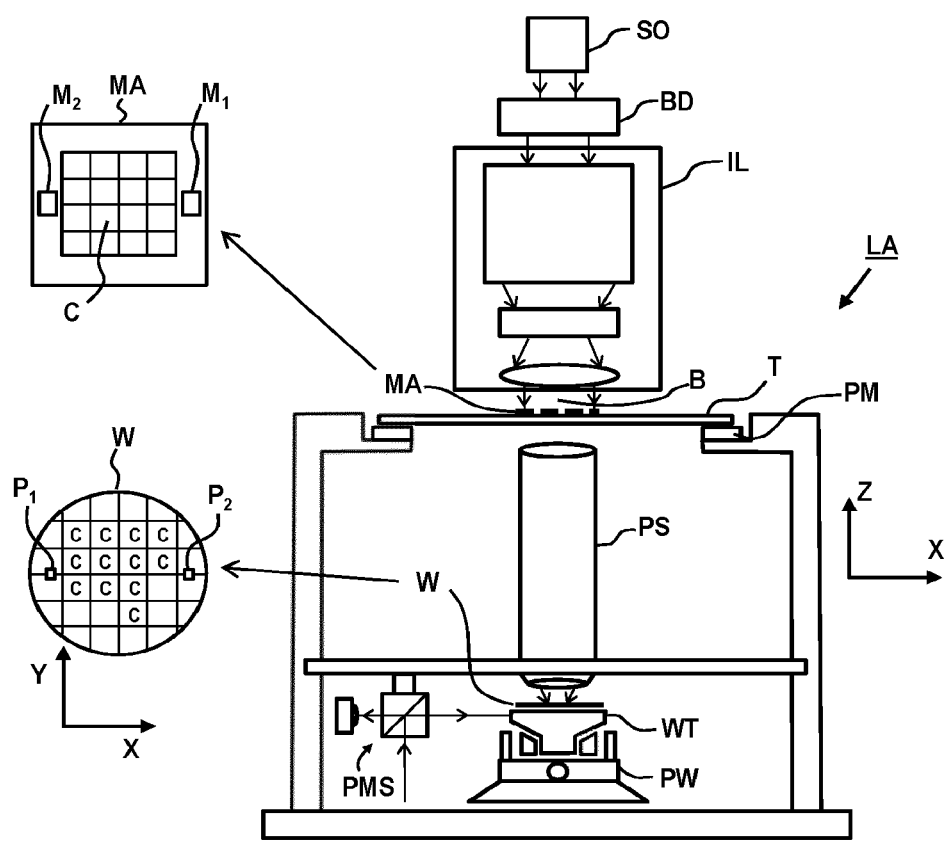
FIG. 1 depicts a schematic overview of a lithographic apparatus.

The present disclosure relates to the field of marks. Marks can be used in lithography or metrology to inspect several metrics or characteristics of an object that has been subjected a lithographic process. Using the mark, it can e.g. be determined whether the lithographic process fulfilled several quality requirements. This can e.g. be done by determining a so-called yield curve and analyzing said yield curve. In practice, the mark comprises a plurality of first layer components on a first layer and a plurality of second layer components on a second layer. Said first layer components and second layer components may be projected on the object during the lithographic process. While the mark has the advantages mentioned above, a disadvantage is that it occupies space on the object which cannot be used for providing functional components. In addition, it takes time to make the mark. One of the objects of the present disclosure, therefore, is to make the mark more efficient, such that e.g. less space is occupied. The inventors have been able to link parameters of the mark and the precision with which yield curve and/or quality parameters can be determined. They have used this to develop, among others, an advantageous method for designing the mark and an advantageous mark.

In practice, the first layer components and the second layer components are arranged in a plurality of overlay configurations. In each overlay configuration, the first layer components are arranged at a different overlay distance from an associated second layer component. The solution the inventors have found may, for example, include determining an overlay step which is the difference between different overlay distances of the plurality of overlay configurations. This may e.g. be done based on the yield curve is a specific situation. The solution may also include determining a largest overlay distance and/or a smallest overlay distance, e.g. based on the yield curve in another specific situation. The solution may further include determining the number of first layer components and associated second layer components in each overlay configuration, e.g. based on the desired precision.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting and is used for clarification only. Instead, another coordinate system, such as a cylindrical coordinate system, may be used. The orientation of the Cartesian coordinate system may be different, for example, such that the z-axis has a component along the horizontal plane.

Figure 2:
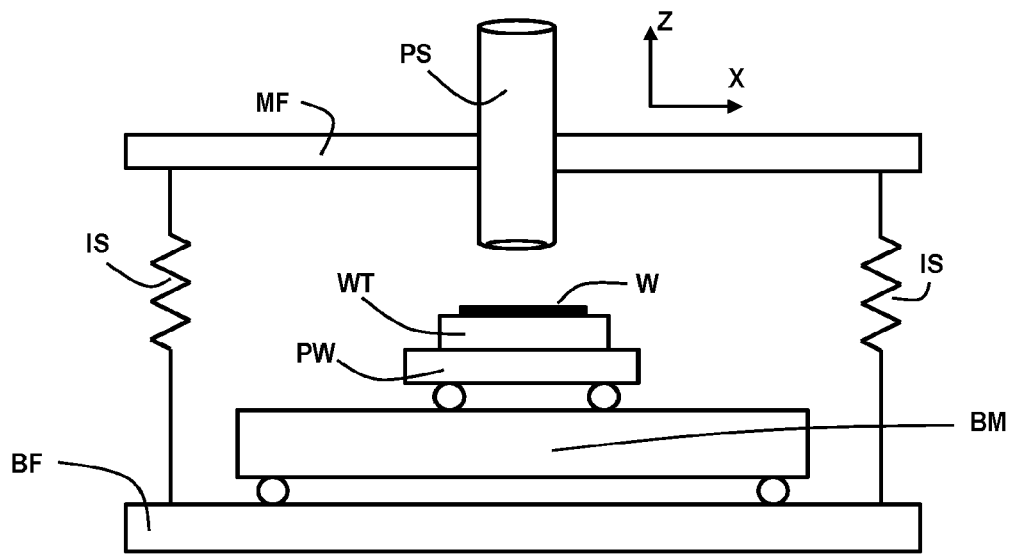
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In some embodiments, the second positioner PW is supported by the balance mass BM. For example, wherein the second positioner PW comprises a planar motor to levitate the substrate support WT above the balance mass BM. In some embodiments, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, United States patent U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In some embodiments, the mirror is connected to the substrate support WT. The reference mirror may be connected to the metrology frame MF. In some embodiments, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
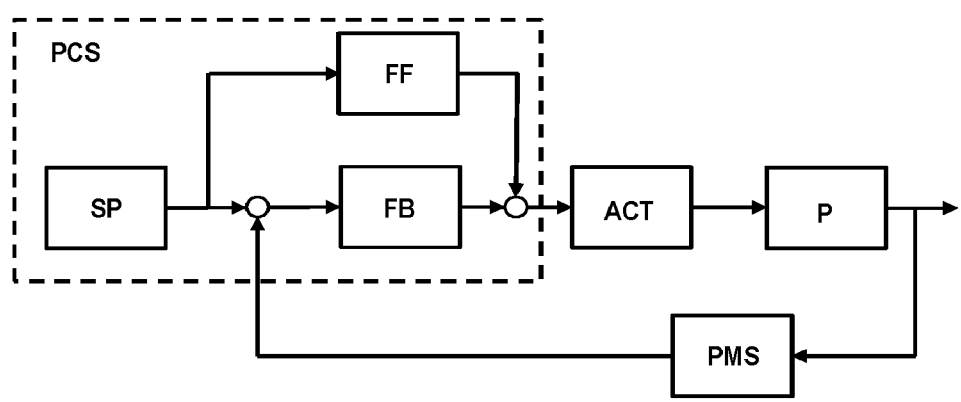
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

A topography measurement system, level sensor or height sensor, and which may be integrated in the lithographic apparatus, is arranged to measure a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

The pattern may be projected onto the substrate in different layers, e.g. one layer after the other layer, which may e.g. be arranged on top of each other. The pattern of a subsequent layer must be arranged correctly relative to pattern of a previous layer, to make sure that conductive paths can be formed through the layers where intended. An inspection tool may be adapted to inspect the pattern. In particular, the lithographic apparatus may be adapted to project a mark on the substrate, e.g. as part of the pattern, wherein the mark may be inspected with the inspection tool. Among others, the mark can be used to determine edge roughness and an overlay, which represents a deviation of position of the pattern of the subsequent layer relative to the pattern of the previous layer can.

Figure 4:
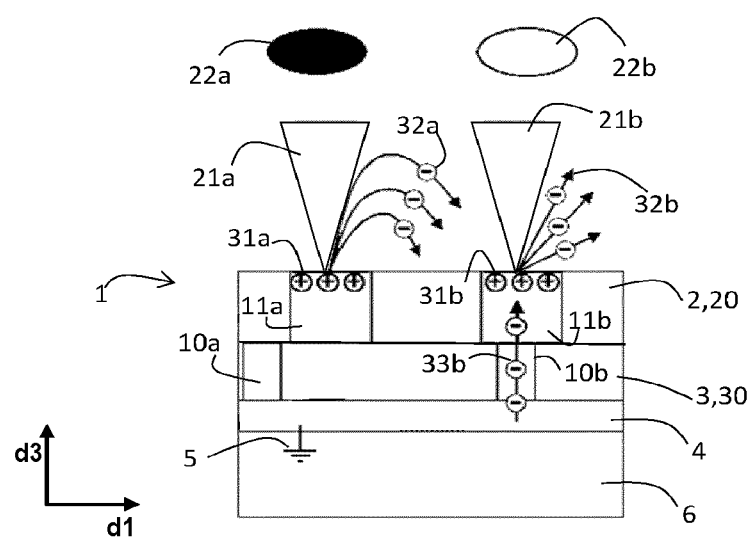
FIG. 4 illustrates a working principle of a mark.

FIG. 4 illustrates a possible working principle of a mark 1. In the shown example, the mark 1 comprises a first layer 3, a second layer 2, a conductive layer 4 and grounded layer 6. The first layer 3 and the second layer 2 may e.g. be an inter-level dielectric (ILD). The conductive layer 4 may e.g. comprise NiPt. The grounded layer 6 may e.g. comprise Si. The second layer 2 comprises a second layer mark 20 which is arranged on a first layer mark 30 of the first layer 3. The first layer mark 30 comprises a plurality of first layer components 10a, 10b, of which two are show: a left first layer component 10a and a right first layer component 10b. During a lithographic process, the second layer 2 is projected onto the first layer 3, thereby e.g. arranging the second layer mark 20 above the first layer mark 30 in a third direction d3, which may be a vertical direction. The second layer mark 20 comprises a plurality of second layer components 11a, 11b, of which two are shown: a left second layer component 11a and a right second layer component 11b. In this case, the left first layer component 10a is associated with the left second layer component 11a, and the right first layer component 10b is associated with the right second layer component 11b. The left second layer component 11a and the associated left first layer component 10a are arranged on a distance of each other in a first direction d1, which may be a horizontal direction. The second layer components 11a, 11b and the first layer components 10a, 10b are made of conductive material. The left first layer component 10a and the associated left second layer component 11a not in contact with each other, and do not form conductive path. The right first layer component 10b and the associated right second layer component 11b are in contact with each other, thereby forming a conductive path towards the conductive layer 4. The conductive layer 4 is grounded to the grounded layer 6, as is illustrated by a ground 5.

The mark 1 may be adapted to be used during an inspection, e.g. a voltage contrast inspection, e.g. voltage contrast edge placement error (VCEPE) inspection. FIG. 4 illustrates a first inspection beam 21a being projected onto the left second layer component 11a and a second inspection beam 21b being projected on the right second layer component 11b. The first and second inspection beams 21a, 21b may e.g. be electron beams. Since the left second layer component 11a and the left first layer component 10a do not form a conductive path with each other, there is no conductive path from the left second layer component 11a towards the ground 5. Positive charges 31a build up in the left second layer component 11a when being subjected by the first inspection beam 21a as electrons 32a are emitted from the left second layer component 11a. The left second layer component 11a becomes positively charged. It will be appreciated, however, that in alternative embodiments in a similar manner the left second layer component 11a may be negatively charged after being subjected to an inspection beam.

The right second layer component 11b, on the other hand, is provided with a conductive path towards the conductive layer 4 via the right first layer component 10b. While electrons 32b are emitted and positive charges 31b build up in the right second layer component 11b, electrons 33b are conducted towards the right second layer component 11b via the right first layer component 10b. The right second layer component 11b is in a neutral state after being subjected to the second inspection beam 21b.

A scanning electron microscope can e.g. be used to obtain an image based on a voltage contrast response of the second layer components 11a, 11b. Preferably, the image represents the voltage contrast response as being binary, wherein e.g. all voltage contrast responses below a threshold value are considered to represent a positively charged second layer component. For example, the positively charged left second layer component 11a is represented by a dark response 22a, and the right second layer component 11b being in a neutral state is represented by a bright response 22b. In this case, dark may refer to the fact that, due to the positive charging of left second layer component 11a, the electrons 32a will be deflected and e.g. not reach a detector. Similarly, bright may refer to the fact that right second layer component 11b can be in a neutral state, such that the emitted electrons 32b are not deflected and will reach a detector. From the image, it can be determined which of the second layer components 11a, 11b forms a conductive path with the first layer components 10a, 10b that it is associated with, which is at least partially determined by the position of the first layer components 10a, 10b relative to the respective associated second layer component 11a, 11b in the first direction d1. As such, a yield curve can be determined as will be explained in more detail below. Also the position of the second layer mark 20 relative to the first layer mark 30 in the first direction d1 can be determined, and as such for example the overlay in the first direction d1 between the second layer 2 and the first layer 3.

Figure 5A:
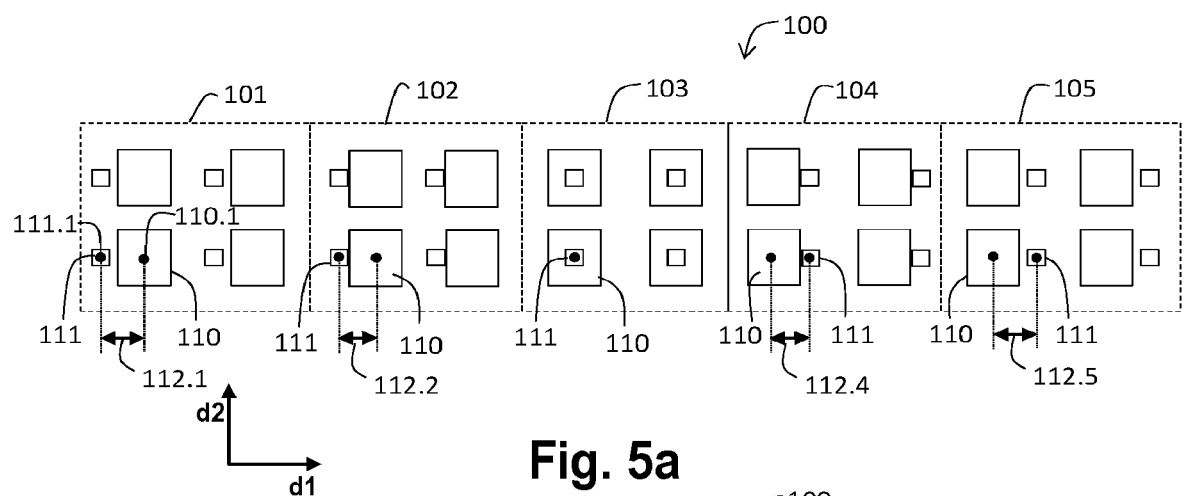
FIG. 5a schematically illustrates a possible implementation of a mark.
Figure 5B:
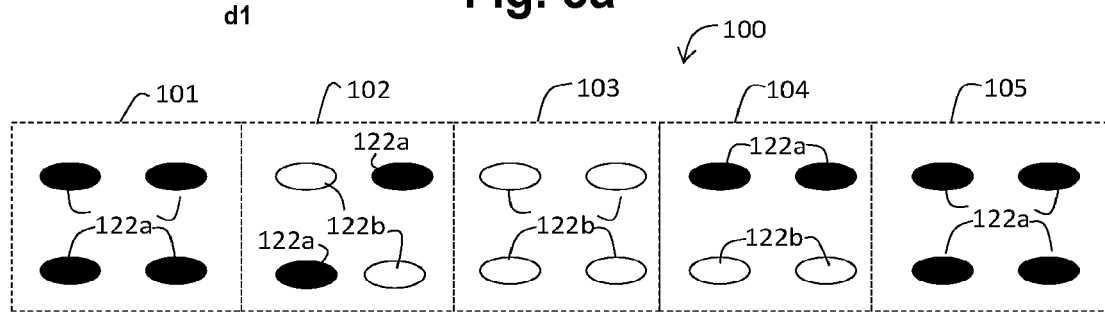
Figure 5C:
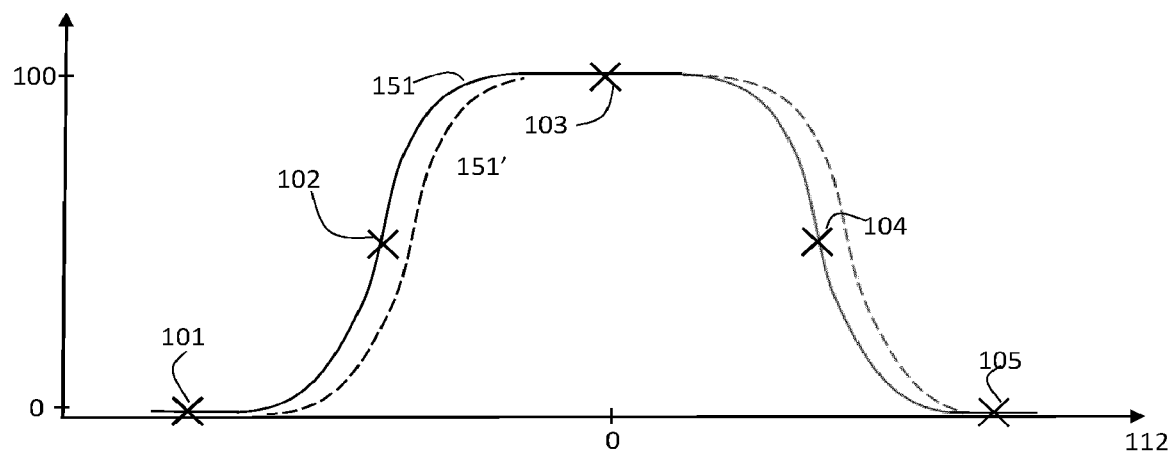
FIG. 5c illustrates a possible yield curve obtained from the responses shown in FIG. 5b.

FIG. 5a-5c schematically illustrates how a mark 100 may be implemented in practice. FIG. 5a shows a top view of the mark 100, in which a first zone 101, a second zone 102, a third zone 103, a fourth zone 104, and a fifth zone 105 of the mark 100 are visible. In each zone 101, 102, 103, 104, 105 four first layer components 111 and four associated second layer components 110 are shown. The first layer components 111 are comprised by a first layer mark which is arranged below a second layer mark by which the second layer components 110 are comprised. In the first zone, the first layer components 111 and the associated second layer components 110 are arranged in a first overlay configuration. In the first overlay configuration, the first layer components 111 and the associated second layer components 110 are arranged at a first overlay distance 112.1 of each other. The first overlay distance 112.1 is measured in the first direction d1 from a center point 110.1 of the associated second layer component 110 to a center point 111.1 of the first layer component 111. The second zone 102 comprises a second overlay configuration with a second overlay distance 112.2. The third zone 103 comprises a third overlay configuration with a third overlay distance which is zero and therefore not visible in FIG. 5a. The fourth zone 104 comprises a fourth overlay configuration with a fourth overlay distance 112.4. The fifth zone 105 comprises a fifth overlay configuration with a fifth overlay distance 112.5.

FIG. 5b illustrates the responses in an image of a scanning electron microscope of the second layer components 110 of the second layer mark 100 after being subjected to an electron beam, as explained above. In this example, a positively charged second layer component 110 is represented by a dark response 122a in the image and a second layer component 110 that is in a neutral state is represented by a bright response 122b. In the first zone 101, each of the responses in the image are dark responses 122a, because the first overlay distance 112.1 is such that the second layer components 110 do not form a conductive path with the first layer components 111 they are associated with. For the same reason, responses in the fifth zone 105 are dark responses 122a. In the third zone 103, the second layer components 110 form a conductive with the first layer components 111 they are associated with, resulting in the image showing bright responses 122b.

In the second zone 102 and the fourth zone 104, there is a mix of bright responses 122b and dark responses 122a. Although the second layer components 110 and the first layer components 111 are not arranged directly above each other, some second layer components 110 may form a conductive path with the first layer components 111 they are associated with, while others do not. This may be because of factors such as material roughness and manufacturing tolerances, as well the electrical resistance of the material of the first layer mark and/or the second layer mark. In function of said factors, statistical models can be used to determine how many of the second layer components 110 are expected to provide a bright response 122b.

Although in FIG. 5a-5b only five zones 101, 102, 103, 104, 105 are shown for clarity, it will be appreciated that in practice more zones may be provided. When seen in a first direction d1, the overlay distances 112 in the different overlay configurations differ by an overlay step. Based on the responses in the image, a yield curve 151 as shown in FIG. 5c can be determined. The horizontal axis in FIG. 5c represents the overlay distance 112. The vertical axis represents the percentage of second layer components in each overlay configuration that forms a conductive path with the first layer component they are associated with, which in this example corresponds with the percentage of bright responses in the image in each of the zones 101, 102, 103, 104, 105. In this theoretical example used for illustration, said percentage in the first zone 101 and the fifth zone 105 is zero, said percentage in the second zone 102 and the fourth zone 104 is 50, and said percentage in the third zone 103 is 100.

In practice it may happen that there is there is deviation in the first direction d1 during the projection a second layer comprising the second layer mark onto the first layer comprising the first layer mark. This may cause a shift of the second layer components 110 relative to the first layer components 111 in the first direction d1, and thereby affect which second layer components 110 form a conductive path with the first layer components 111 they are associated with. This results in a different percentage of bright responses 122b for some of the overlay configurations, and as such a second yield curve 151' which is shifted relative to the yield curve 151. The second yield curve 151' contains information from which various metrics can be determined. For example, an overlay of the second layer relative to the first layer may be determined from the second yield curve 151'. For example, a material roughness of the first layer components 111 and/or second layer components 110 can be determined from the second yield curve 151'. For example, information relating to a process window can be determined from the second yield curve 151'. For example, a variation of critical dimensions of the first layer components 111 and/or second layer components 110 can be determined from the second yield curve 151'.

FIG. 5a further shows that optionally the second layer components 110 are larger than the first layer components 111 in a second direction d2, which may e.g. be a horizontal direction perpendicular to the first direction d1. This allows that a shift of the second layer mark relative to the first layer mark in the second direction d2 has limited effect on which first layer components 111 form a conductive path with their associated second layer component 110. Optionally, the mark 100 may also comprise different overlay configurations in which the position of the first layer components 111 relative to associated second layer components 110 in the second direction d2 is different, or an additional mark may be provided having different overlay configurations in which the position of the first layer components 111 relative to associated second layer components 110 in the second direction d2 is different.

As mentioned above, in practice the second layer mark 100 may comprise more than five different overlay configurations as shown in FIG. 5a. In addition, each overlay configuration may comprise more than four second layer components 110 and more than four first layer components 111. It will be appreciated that on the one hand, possibly a more precise determination of the (shifted) yield curve can be determined, if more second layer components 110 and overlay configuration are provided. On the other, that would require a larger mark 100, whereas there may only be limited space on the object and/or the pattern which comprises the mark 100. The inventors have found a solution for providing an efficient mark, taking into account these diverging requirements.

Figure 6A:
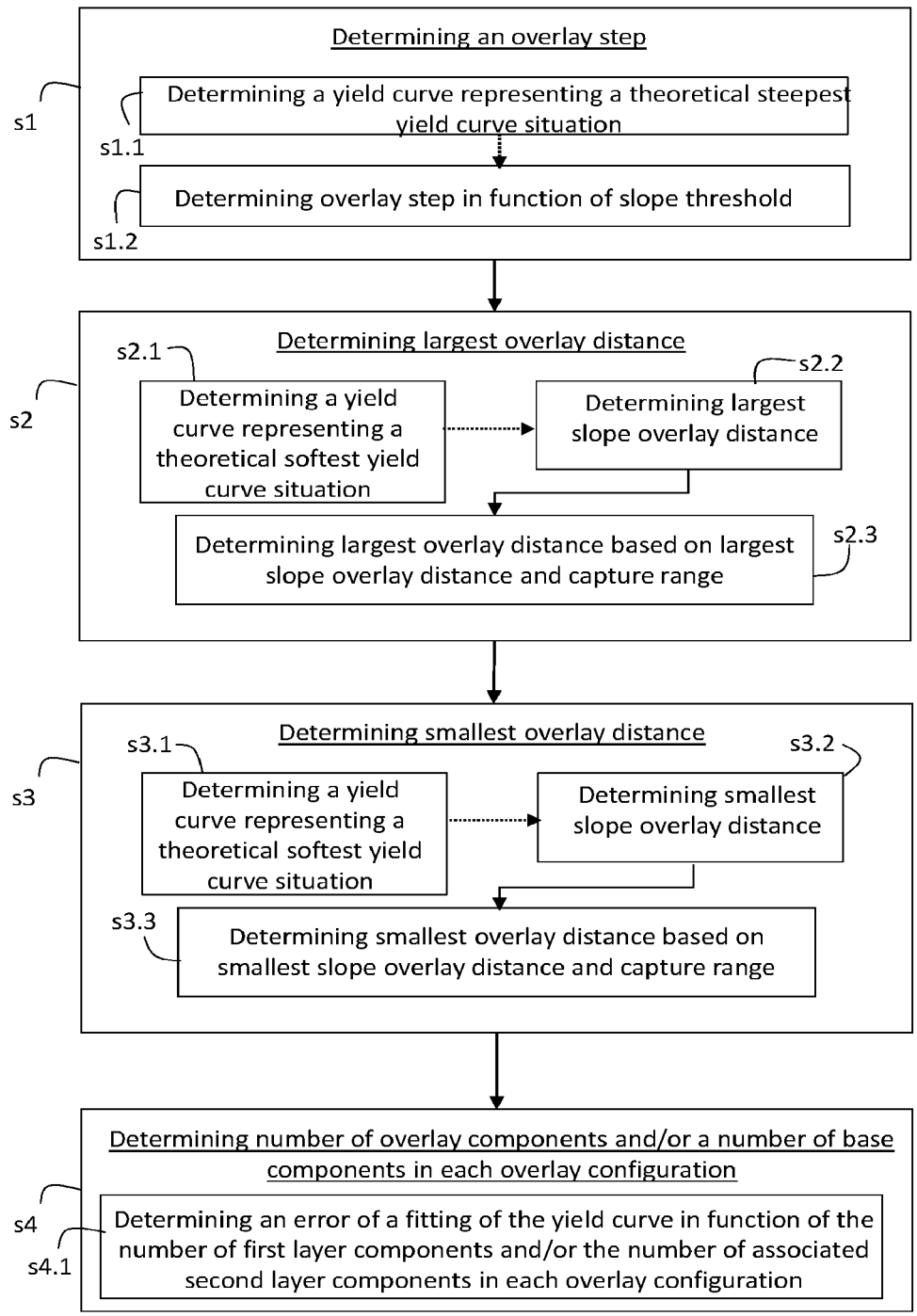
FIG. 6a schematically illustrates a method according to some embodiments of the present disclosure.
Figure 6B:
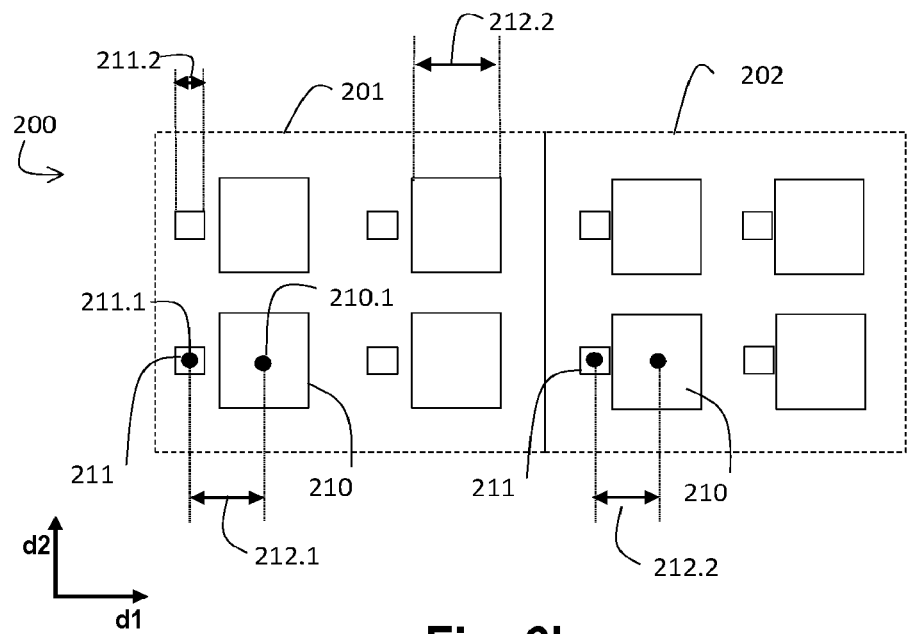
FIG. 6b schematically illustrates a mark according to some embodiments of the present disclosure.
Figure 6C:
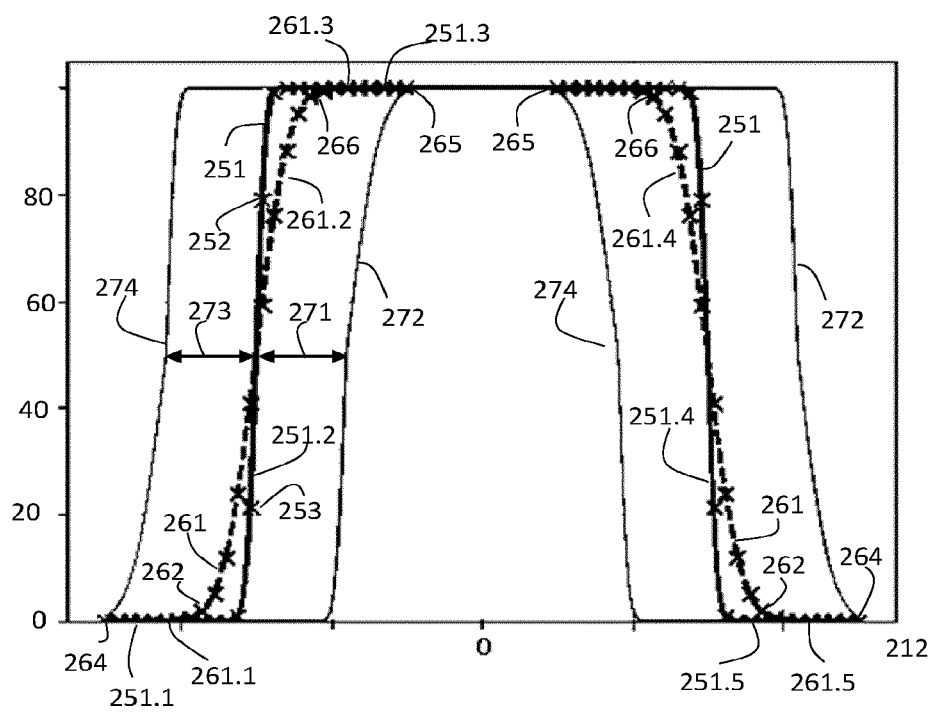
FIG. 6c illustrates possible yield curves of the mark.

The present disclosure relates to a computer readable medium, comprising instructions adapted to, when executed on a processing unit, make the processing unit perform a method for designing a mark adapted to be projected onto an object during a lithographic process. Embodiments of said method will be explained below. The present disclosure also relates to the method for designing a mark and to a mark, which are explained below with reference to FIG. 6a-6c. FIG. 6a schematically illustrates various possible steps of the method disclosed herein. It is noted that although FIG. 6a illustrates a possible order of performing the steps of the method, it is not limited thereto. The steps may be performed in another suitable order, and/or one or more steps may be omitted, and/or one or more additional steps may be performed. FIG. 6b schematically illustrates a part of a mark 200 according to some embodiments of the present disclosure. FIG. 6c illustrates various possible yield curves of the mark 200 according to some embodiments of the present disclosure.

The method described herein is a method for designing a mark 200 adapted to be projected onto an object during a lithographic process. The mark 200 comprises a first layer mark having a plurality first layer components 211, and a second layer mark having a plurality second layer components 210. The first layer mark and the second layer mark are adapted to be projected onto each other during the lithographic process. The first layer components 211 and the second layer components 210 are adapted to be arranged in a plurality of different overlay configurations 201, 202, each overlay configuration 201, 202 comprising a number of the plurality of the first layer components 211 and a number of the plurality of the second layer components 210, and each overlay configuration 201, 202 having a different overlay distance 212.1, 212.2 at which each first layer component 211 is arranged in a first direction d1 of an associated second layer component 210 of the second layer components 210. The method comprises a step s1 of determining an overlay step which represents a difference between the different overlay distances 212.1, 212.2 of the plurality of overlay configurations 201, 202. The method comprises a step s2 of determining a largest overlay distance 264. The method comprises a step s4 of determining the number of first layer components 211 and/or the number of associated second layer components 210 in each overlay configuration.

The present disclosure further relates to mark 200 adapted to be projected onto an object during a lithographic process. The mark 200 comprises a first layer mark having a plurality first layer components 211, and a second layer mark having a plurality second layer components 210. The first layer mark and the second layer mark are adapted to be projected onto each other during the lithographic process. The first layer components 211 and the second layer components 210 are adapted to be arranged in a plurality of different overlay configurations 201, 202, each overlay configuration 201, 202 comprising a number of the plurality of the first layer components 211 and a number of the plurality of the second layer components 210, and each overlay configuration 201, 202 having a different overlay distance 212.1, 212.2 at which each first layer component 211 is arranged in a first direction d1 of an associated second layer component 210 of the second layer components 210. The overlay distances 212.1, 212.2 are between a smallest overlay distance 265 and a largest overlay distance 264, and differ between the plurality of overlay configurations 201, 202 by an overlay step. The smallest overlay distance 265 may e.g. be larger than zero.

FIG. 6b schematically illustrates the mark 200. The mark 200 may e.g. be a mark for use in an inspection method. The mark 200 may e.g. be VCEPE mark. The mark 200 may e.g. be adapted to be subject to an electron beam. It will be appreciated that although only two overlay configurations 201, 202 each only having four first layer components 211 and four second layer components 210, in practice there are usually more overlay configurations 201, 202 and/or more first layer components 211 and second layer components 210. As can be seen in FIG. 6b, the overlay distances 212.1, 212.2 are measured in the first direction d1 from a center point 211.1 of the first layer component 211 to a center point 210.1 of the associated second layer component 210. The first layer component 211 and the second layer component 210 comprise conductive materials, and are able to form a conductive path, e.g. when they are in contact with each other. The first layer components 211 may e.g. be electrically connected to a ground.

In similar ways as explained above, the mark 200 may be used to determine a yield curve. For example, the mark 200 may be subjected to an electron beam, and an image may be determined representing which of the second layer components 210 forms a conductive path with the first layer component 211 it is associated with. Based on the image, the yield curve may be determined. The yield curve can be used to determine various metrics, e.g. overlay, process window, edge roughness, local critical dimension uniformity (LCDU).

In the shown example, the second layer component 210 has a square shape when seen from top view, with a critical dimension 210.2, which may e.g. be 10 nm-100 μm, e.g. 1-100 μm. The first layer component 211 has a square shape when seen from top view, with a critical dimension 211.2, which may e.g. be 20 nm. In other embodiments, the shape and/or sizes of the first layer components 211 and second layer components 210 may be different. In embodiments, the first layer components 211 may be arranged on periodic distances of each other, optionally equidistantly. In embodiments, the second layer components 210 may be arranged on periodic distances of each other, optionally equidistantly.

In embodiments of the method, the step s1 of determining the overlay step includes a step s1.1 of determining a yield curve 251 representing a theoretical steepest yield curve situation. The yield curve 251 represents, for each overlay configuration 201, 202 and in function of the overlay distance 212, the percentage of second layer components 210 of said overlay configuration 201, 202 which form a conductive path with the first layer component 211 of said overlay configuration it is associated with. The yield curve 251 comprises at least a first lower level 251.1, a first higher level 252.3, and a first slope 252.2 between the first lower level 251.1 and the first higher level 251.3. The theoretical steepest yield curve situation corresponds with the situation in which the first slope 251.2 is the steepest. The step s1 of determining the overlay step further includes a step s1.2 of determining the overlay step such that, in theoretical steepest yield curve situation, the number of overlay configurations 201, 202 on the first slope 251.2 is above a slope threshold. In embodiments of the mark 200, the mark 200 is adapted to be arranged on the object in a theoretical steepest yield curve situation, wherein the overlay step is such that the number of overlay configurations 201, 202 on a first slope 251.2 of a yield curve 251 in the theoretical steepest yield curve situation is above a slope threshold.

The yield curve 251 is illustrated in FIG. 6c. The horizontal axis in FIG. 6c represents the overlay distance 212. The overlay distance 212 is different in each overlay configuration 201, 202. The smallest difference between the overlay distances 212 in the different overlay configurations is the overlay step. The overlay step is preferably constant, meaning that between a smallest overlay distance and a largest overlay distance 264, there are a number of overlay configurations 201, 202 each having an overlay distance 212 which is larger or smaller than the overlay distance 212 of one of the other overlay configurations 201, 202 by the overlay step. Each overlay configuration is represented by a cross x in the graph in FIG. 6c. Optionally, the mark comprises overlay configurations with a positive overlay distance and overlay configurations with a negative overlay distance. Optionally, for each overlay configuration with a positive overlay distance there is an overlay configuration with a negative overlay distance having the same absolute value as said positive overlay distance. It is noted that in the context of this disclosure, when terms like "largest overlay distance" and "smallest overlay distance" are used, the absolute value of the overlay distance is meant.

The vertical axis in FIG. 6c represent the percentage of second layer components that form a conductive path with first layer component in each overlay configuration 201, 202, which may also be referred to as the yield of the respective overlay configuration. The yield can be determined in the ways explained above. The yield curve 251 can be determined from the yields of the plurality of overlay configurations 201, 202. The yield curve 251 comprises at least the first lower level 251.1, the first slope 251.2 and the first higher level 251.2 In the shown example, the yield curve 251 further comprises a second slope 251.4 and a second lower level 251.5, which is a consequence of the fact that the mark 200 comprises overlay configurations 201, 202 with negative overlay distances 212 as well as overlay configurations 201, 202 with positive overlay distances 212.

As can be seen, for most overlay configurations the yield is on the first higher level 251.3, the first lower level 251.1 or the second lower level 251.5. In the overlay configurations that the yield is on the first higher level 251.3, the overlay distance 212 may e.g. be such that the first layer components 211 and their associated second layer 210 components are arranged directly above each other. In theory, this would cause them to be in contact and always form a conductive path. In practice, however, there may be some first layer components 211 and/or second layer components 212 that fail, e.g. due to manufacturing errors, causing the yield to be slightly below 100% on the first higher level 251.3. For example, the yield in said overlay configurations may be 100% minus a failure rate. In the overlay configurations that yield the first lower level 251.1 or the second lower level 251.5, the overlay distance 212 may e.g. be such that very little of the first layer components 211 and their associated second layer components 210 form a conductive path, e.g. because they are arranged relatively far from each other in the first direction d1.

For some of the overlay configurations, the yield is on the first slope 251.1 or on the second slope 251.2, e.g. for overlay configurations 252 and 253 indicated in FIG. 6c. In those overlay configurations, some first layer components form a conductive path with the associated second layer component while others do not. This may e.g. be a consequence of material roughness of the first layer components 211 and/or the second layer components 210, and the electrical resistance of the material of the layers in which the first layer components 211 and/or the second layer components 210 are arranged. In general, the mark 200, and e.g. the pattern of which the mark 200 is part, may be adapted to be applied in a variety of application. For example, the layers of the object on which the mark 200 is projected may comprise different materials, and/or the second layer components 210 and/or the first layer components 211 may comprises different materials. Also the accuracies and/or tolerances during manufacturing of the object, second layer components 210, and/or first layer components 211 may differ.

In practice when the mark 200 is arranged on an object, an inspection beam may be directed onto the mark 200 (as explained with reference to FIG. 4) and based on the voltage contrast responses the yield of each overlay configuration can be determined (as explained with reference to FIG. 5a-5c). Based on the yield of each overlay configuration, the yield curve can be determined. In order to be able to determine said yield curve precisely, there should be sufficient overlay configurations that have a yield on the first slope and/or second slope of said yield curve. How many overlay configurations are on first slope and/or second slope of said yield curve depends on the steepness of the slope as well as the overlay step.

Since the steepness of the first slope and the second slope of the yield curve are dependent on the specific situation in which the mark 200 is applied, the present embodiments include determining the yield curve 251 that represents a theoretical steepest yield curve situation. This corresponds with the situation in which the first slope 251.2 of the yield curve is the steepest, of all situations in which the mark 200 is adapted to be applied. The overlay step is then such that, for said yield curve 251, the number of overlay configurations 201, 202 on the first slope 251.2 is above a slope threshold. As such, it can be ensured that for all situations in which the mark 200 is adapted to be applied, the number of overlay configurations 201, 202 on the respective first slope is above a slope threshold. As such, the yield curve can be determined precisely.

The slope threshold may e.g. be two, three, four, five, or ten. The slope threshold may e.g. be determined based on a fitting function that is used for determining the yield curve or the slope of the yield curve. It may e.g. be required to have a certain number of known points on the yield curve to be able to match the fitting function to the yield curve, based on which the slope threshold can be determined.

In embodiments, the theoretical steepest yield curve situation is determined in function of the possible materials of the first layer components 211 and/or second layer components 210. For example, the theoretical steepest yield curve situation may be the situation wherein the second layer components 210 and/or the first layer components 211 have the smallest roughness and/or the largest correlation length. The determining of the theoretical steepest yield curve situation may e.g. be done based on design parameters and/or design constraints of the mark 200.

In embodiments of the method, the step s2 of determining the largest overlay distance 264 includes a step s2.1 of determining a yield curve 261 representing a theoretical softest yield curve situation. The yield curve 261 represents, for each overlay configuration 201, 202 and in function of the overlay distance 212, the percentage of second layer components 210 of said overlay configuration 201, 202 which form a conductive path with the first layer component 211 of said overlay configuration 201, 202 it is associated with. The yield curve 261 comprises at least a first lower level 261.1, a first higher level 262.3, and a first slope 262.2 between the first lower level 261.1 and the first higher level 261.3. The theoretical softest yield curve situation corresponds with the situation in which the first slope 261.2 is the least steep. The step s2 of determining the largest overlay distance 264 further includes: a step s2.2 of determining a largest slope overlay distance 262 in the theoretical softest yield curve situation, wherein the largest slope overlay distance 262 corresponds with the largest overlay distance on the first slope 262.2; and a step s2.3 determining the largest overlay distance 264 based on the largest slope overlay distance 262 and a capture range deviation 271, 273. In embodiments of the mark 200, the mark 200 is adapted to be arranged on the object in a theoretical softest yield curve situation, wherein the largest overlay distance 264 corresponds with a combination of a largest slope overlay distance 262 in the theoretical softest yield curve situation and a capture range deviation 271, 273.

FIG. 6c shows the yield curve 261 representing theoretical softest yield curve situation. The yield curve 261 may be determined in similar manners as the yield curve 251, and in the shown example comprises a second slope 261.4 and a second lower level 261.5.

As explained above, in practice the yield curve shifts when the second layer mark and the first layer mark are shifted relative to each other in the first direction d1. The capture range deviation 271, 273 represents the range of shifts for which it is desired that the yield curve is determinable with the mark 200. The capture range deviation 271, 273 includes a first direction deviation 271 and an opposite direction deviation 273. The first direction deviation 271 represents how much the second layer mark may shift in the first direction d1 relative to the first layer mark. The opposite direction deviation 273 represents how much the second layer mark may shift in the direction opposite of first direction d1 relative to the first layer mark. FIG. 6c further shows a first maximal shifted slope curve 272 representing how the first direction deviation 271 may affect the first and second slope of the yield curve, and a second maximal shifted slope curve 274, representing how the opposite direction deviation 273 may affect the first and second slope of the yield curve. The first and second maximal shifted slope curve 272, 274 are determined by the first and second slope 261.2, 261.4 of the yield curve 261 representing the theoretical softest yield curve situation as well as the first and second slope 251.2, 251.4 of the yield curve 251 representing the theoretical steepest yield curve situation. The largest overlay distance 264 is determined by the yield curve 261 representing the theoretical softest yield curve situation. When the second layer mark is shifted relative to the first layer mark by the largest of the first direction deviation 271 and the opposite direction deviation 273, it would preferably be possible to determine the yield curve. It would in particular be preferred that the first slope and/or second slope of the yield curve can be determined precisely.

The yield curve 261 representing a theoretical softest yield curve situation taken into account for determining the largest overlay distance 264. In the particular, the largest slope overlay distance 262 of the yield curve 261 is determined. Then, the largest overlay distance 264 is determined, e.g. by adding the capture range deviation 271, 273 to the absolute value of the largest slope overlay distance 262 to obtain the absolute value of the largest overlay distance 264. For example, the largest slope overlay distance 262 may be determined as the overlay distance that corresponds with a predetermined absolute yield, e.g. 10%, 5%, 3%, or 2%, or having a predetermined relation with the yield at the first higher level, e.g. 10%, 5%, 3%, or 2%, of said yield. For example, based on the overlay step, the overlay distances 212 of the overlay configurations between the largest slope overlay distance 262 and the largest overlay distance 264 can be determined.

In embodiments, the method further comprises a step s3 of determining a smallest overlay distance 265. For example, the smallest overlay distance 265 may have an absolute value that is larger than zero. The inventors have found that in overlay configurations with a very small overlay distance, the percentage of second layer components 210 that forms a conductive path with the first layer component 211 they are associated with does not vary much, even when the second layer mark 200 is shifted by the first direction deviation 271 or by the opposite direction deviation 273. Said overlay configurations do not provide valuable information for determining the yield curve, and are in accordance with these embodiments omitted. Advantageously, the mark 200 occupies less space of the object, pattern, and/or reticle.

In embodiments of the method, the step s3 of determining the smallest overlay distance 265 includes a step s3.1 of determining a yield curve 261 representing a theoretical softest yield curve situation. The yield curve 261 represents, for each overlay configuration 201, 202 and in function of the overlay distance 212, the percentage of second layer components 210 of said overlay configuration 201, 202 which form a conductive path with the first layer component 211 of said overlay configuration 201, 202 it is associated with. The yield curve 261 comprises at least a first lower level 261.1, a first higher level 262.3, and a first slope 262.2 between the first lower level 261.1 and the first higher level 261.3. The theoretical softest yield curve situation corresponds with the situation in which the first slope 261.2 is the least steep. It will be appreciated, however, that in practice it may be sufficient to perform only one of step s2.1 and step 3.1. The step s3 of determining the smallest overlay distance 265 further includes: a step s3.2 determining a smallest slope overlay distance 266 in the theoretical softest yield curve situation, wherein the smallest slope overlay distance 266 corresponds with the smallest overlay distance on the first slope 261.2; and a step s3.3 of determining the smallest overlay distance 265 based on the smallest slope overlay distance 266 and a capture range deviation 271, 273. In embodiments of the mark 200, the mark 200 is adapted to be arranged on the object in a theoretical softest yield curve situation, wherein the smallest overlay distance 265 corresponds with a combination of a smallest slope overlay distance in the theoretical softest yield curve situation and a capture range deviation 271, 273.

Similarly to the determination of the largest overlay distance 264 explained above, the yield curve 261 corresponding theoretical softest yield curve situation is taken into account for determining the smallest overlay distance 265. For said situation, the smallest slope overlay distance 266 is determined. Then, the smallest overlay distance 265 is determined, e.g. by subtracting the capture range deviation 271, 273 from the absolute value of the smallest slope overlay distance 266 to obtain the absolute value of the smallest overlay distance 265. For example, the smallest slope overlay distance 266 may be determined as the overlay distance that corresponds with a predetermined absolute yield, e.g. 85%, 90%, 93%, 95% or 98%, or having a predetermined relation with the yield at the first higher level, e.g. 85%, 90%, 93%, 95% or 98% of said yield. For example, based on the overlay step, the overlay distances of the overlay configuration between the smallest slope overlay distance 266 and the smallest overlay distance 265 can be determined.

In embodiments, the theoretical softest yield curve situation is determined in function of the possible materials of the first layer component 211 and second layer components 210. For example, the theoretical softest yield curve situation may be the situation wherein the second layer components 210 and/or the first layer components 211 have the largest roughness and/or the smallest correlation length. The determining of the yield curve 261 may e.g. be done based on design parameters and/or design constraints of the mark 200.

In embodiments of the method, the number of first layer components 211 and the number of associated second layer components 210 in each overlay configuration 201, 202 are determined in function of a desired precision. In embodiments of the mark 200, the number of first layer components 211 and the number of associated second layer components 210 in each overlay configuration 201, 202 are adapted to obtain a desired precision.

Figure 7:
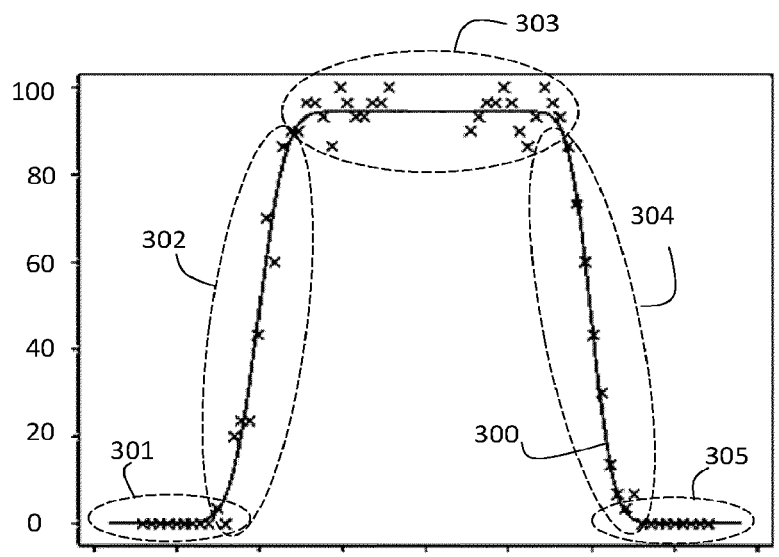
FIG. 7 illustrates how in practice the yield in an overlay configuration may deviate from a theoretical yield.

In each overlay configuration 201, 202, there are a number of first layer components 211 that are arranged at the overlay distance 212.1, 212.2 of an associated second layer component 210. The yield curve is obtained based on the percentage of second layer components 210 in each overlay configuration 201, 202 that forms a conductive path with the first layer component 211 they are associated with. The inventors have found that in practice, however, the obtained percentage during inspection may deviate from the yield curve, as is e.g. illustrated in the graph in FIG. 7. FIG. 7 shows an example of a yield curve 300 that may be obtained in practice from the yields that have been determined for the plurality of overlay configurations. The yield curve 300 comprises a first lower level 301, a first slope 302, a first higher level 303, a second slope 304, and a second lower level 305. At the first higher level 303, most overlay configurations yield a percentage below 100, and it is visible that there is variation of the yield in the overlay configurations, causing said yields to deviate from the yield curve. Also at the first lower level 301, the second lower level 305, the first slope 302 and the second slope 304, various overlay configurations deviate from the yield curve 300.

The variance in the yield may e.g. be a consequence of the fact that during the inspection, the voltage contrast responses of the second layer components are made binary based on a threshold value, i.e. each second layer component is considered to either be in a neutral state or be charged, either positively or negatively depending on the inspection beam. Noise in this method causes variance and imprecision in the determination of the yield, and consequently the determination of the yield curve. In accordance with statistical models, the variance will decrease, and the determined yield will converge towards the expected value, i.e. a theoretical yield curve, as the number of first layer components and/or associated second layer components increases. The number of first layer components and/or the number of associated second layer components may therefore be determined in function of the desired precision of determining the yield curve. For example, the number of first layer components and/or the number of associated second layer components in each overlay configuration may be between 10-1000, e.g. 50, 250, or 500.

In embodiments, the method may comprise a step s4.1 of determining an error of a fitting of the yield curve 300 in function of the number of first layer components and/or the number of associated second layer components in each overlay configuration, for example following similar methods as in the paper Estimating Errors in Least-Squares Fitting by P. H. Richter, as Published in TDA Progress Report 42-122 on Aug. 15, 1995.

In embodiments, it is also possible to determine a high number of possible theoretical yield curves for a number of first layer components and/or a number of associated second layer components, from which a standard deviation or variance can be determined. The number of first layer components and/or number of associated second layer components can be adapted until the standard deviation corresponds with the desired precision.

In embodiments, the number of first layer components and/or the number of associated second layer components is the same in each overlay configuration. In embodiments, the number of first layer components is equal to the number of associated second layer components in said overlay configuration. In other embodiments, the number of first layer components may be larger than the number of associated second layer component, or vice versa, in one or more of the overlay configurations. In such cases, the second layer component may be able to form a conductive path with one or more of the first layer components that it is associated with.

In embodiments, the number of first layer components and/or the number of associated second layer components in each overlay configuration is a predetermined number, e.g. between 10-1000, e.g. 50, 250, or 500.

The yield curve 300 shown in FIG. 7 may e.g. be used to determine several metrics. For example, an overlay of the second layer comprising the second layer components relative to the first layer comprising the first layer components may be determined. For example, from the yield curve 300 a first overlay distance corresponding with a yield of 50% can be determined on the first slope 302, which may e.g. have negative value. A second overlay distance corresponding with a yield of 50% can be determined on the second slope 304, which may e.g. have a positive value. The overlay corresponds with the sum of the first overlay distance and the second overlay distance, divided by two. It will be appreciated that the overlay can also be determined using other points of the yield curve. Another metric that can be determined is the roughness of the first layer components and/or the second layer components, as they determine the steepness of the first slope 302 and the second slope 304. Another metric that can be determined is the variation in critical dimensions of the first layer components and/or second layer components. Another metric that can be assessed is the process window. The process window represents for one or more process parameters within which values the process, e.g. the lithographic process, can be performed such that the object is within desired specifications. Based on the yield curve, it can be determined whether one or more of said process parameters are within said values.

Although the figures show that the second layer mark is arranged on the first layer mark, it will be appreciated that in practice it is also possible to arrange the first layer mark on the second layer mark. Although explained herein with reference to a single mark, it will be appreciated that in practice a plurality of marks may be provided for an object. It is also possible to provide a mark that provides a yield curve that shifts when the first layer mark and the second layer mark are shifted relative to each other in a second direction, which may e.g. a horizontal direction perpendicular to the first direction. Said mark may e.g. be used for determining overlay in a second direction. It is also possible to provide a third layer on the object, having a third layer mark, comprising third layer components which are able to form a conductive path with an associated second layer component and an associated first layer components. Although FIG. 5a and FIG. 6b show the first layer components and the associated second layer components of an individual overlay configuration being arranged in a matrix-form, it will be appreciated that in practice other arrangements are possible, e.g. in one or more rows, or being arranged on different locations of the object.

The present disclosure further relates to an object comprising a mark described herein. For example, the object may be substrate W as shown in FIG. 1, wherein the mark is projected onto the object by the lithographic apparatus LA. For example, a mark pattern may be part of the pattern imparted to the radiation beam B by the patterning device MA.

The present disclosure further relates to a reticle arrangement comprising one or more reticles, which may e.g. be a patterning device MA as shown in FIG. 1. The reticles comprise patterns adapted to be projected onto an object during a lithographic process, wherein the patterns comprise a mark pattern for projecting a mark onto the object. The mark may be the mark described herein, e.g. be in accordance with one or more embodiments described herein. For example, a first reticle of the reticle arrangement may comprise a pattern for projecting the first layer mark onto the object, and a second reticle of the reticle arrangement may comprise a pattern for projecting the second layer mark onto the object.

The present disclosure further relates to a mark design for an overlay, wherein the mark design is designed according to the method described herein, e.g. comprising one or more of the steps of the method shown in FIG. 6a.

Figure 8:
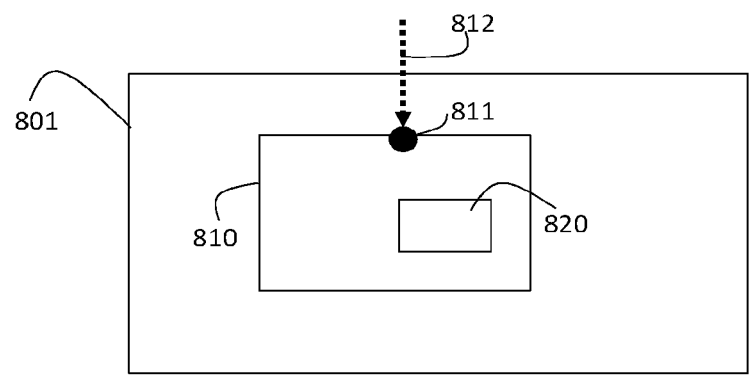
FIG. 8 schematically illustrates an apparatus and computer program product for performing the method according to some embodiments of the present disclosure.

The present disclosure further relates to an apparatus 801, schematically illustrated in FIG. 8. The apparatus 801 comprising a processing unit 810, wherein the processing unit 810 is adapted to perform the method described herein, e.g. one or more of the steps of the method shown in FIG. 6a.

FIG. 8 further illustrates an example computer program product 820, comprising instructions adapted to, when executed on a processing unit 820, make the processing unit 820 perform the method described herein, e.g. one or more of the steps of the method shown in FIG. 6a. As is illustrated in FIG. 8, the computer program product 820 may e.g. be installed on the processing unit 810. It is also possible that the computer program product is installed on another suitable carrier that can e.g. be connected to the apparatus 801, e.g. by inserting it in the apparatus 801 or by means of wireless transmission such as internet.

FIG. 8 further illustrates that the processing unit 810 optionally comprises an input terminal 811 for receiving input information 812. The input information 812 may e.g. relate to one or more of the following or information for determining the following: the materials of the first layer components and second layer components for which the mark is adapted to be applied, or their characteristics such as material roughness, at least for the theoretical steepest yield curve situation and/or the theoretical softest yield curve situation; the desired precision of determining the yield curve; the capture range deviation; the slope threshold; the critical dimensions of the first and/or second layer components.

The present disclosure further relates to a method for projecting a pattern on an object during a lithographic process. The method comprises projecting a mark onto the object. The mark is a mark described herein and/or the mark designed according to the method described herein. The pattern may e.g. comprise a mark pattern for imparting the mark onto the object. This method may e.g. be performed with a lithographic apparatus LA as shown in FIG. 1. The object may e.g. be a substrate W or a wafer. A projection system (e.g., a refractive projection lens system) PS may e.g. be configured to project a pattern comprising the mark imparted to the radiation beam B by patterning device MA onto a target portion C (e.g., comprising one or more dies) of the substrate W.

The present disclosure further relates to a method for inspecting an object, wherein the object comprises a mark. The mark is a mark described herein and/or the mark designed according to the method described herein. The method for inspecting comprises a step of projecting an electron beam onto the mark, and a step of determining a voltage contrast response for the second layer components. The method further comprises a step of determining a yield curve based on the voltage contrast responses, wherein the yield curve represents, for each overlay configuration and in function of the overlay distance, the percentage of second layer components of said overlay configuration which form a conductive path with the first layer component of said overlay configuration it is associated with. In embodiments, the method may further comprise a step of determining an overlay of the first layer mark and the second layer mark, based on the yield curve. In embodiments, the method may further comprise a step of determining a material roughness of the first layer components and/or the second layer components based on the yield curve. In embodiments, the method may further comprise a step of determining a variation of critical dimensions of the first layer components and/or the second layer components. In embodiments, the method may further comprise a step of assessing a process window based on the yield curve.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the present disclosure in the context of a lithographic apparatus, embodiments of the present disclosure may be used in other apparatuses. Embodiments of the present disclosure may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the present disclosure in the context of optical lithography, it will be appreciated that they, where the context allows, are not limited to optical lithography and may be used in other applications, for example imprint lithography.

Where the context allows, embodiments of the present disclosure may be implemented in hardware, firmware, software, or any combination thereof. Embodiments of the present disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the present disclosure have been described above, it will be appreciated that the invention may be practiced otherwise than as described. The descriptions above are intended to be illustrative, not limiting. Thus it will be apparent to one skilled in the art that modifications may be made to the technology as described without departing from the scope of the claims set out below.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

The terms "a" or "an", as used herein, are defined as one or more than one. The terms including and/or having, as used herein, are defined as comprising (i.e., open language, not excluding other elements or steps). Any reference signs in the claims should not be construed as limiting the scope of the claims.

The mere fact that certain measures are recited in mutually different dependent claims does not indicate that a combination of these measures cannot be used to advantage.

A single processor or other unit may fulfil the functions of several items recited in the description and claims, e.g. of control units. Any communication between features can be wired or wireless according to known methods.

The method described herein may be implemented as a program, computer program or software application, or the like. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

A computer program may be stored and/or distributed on a suitable medium, such as an optical storage medium or a solid-state medium supplied together with or as part of other hardware, but also be distributed in other forms, such as via the Internet or other wired or wireless telecommunication systems.

The embodiments of the present disclosure may be described in accordance with one or more of the following clauses:

1. Computer readable medium, comprising instructions adapted to, when executed on a processing unit, make the processing unit perform a method for designing a mark adapted to be projected onto an object during a lithographic process, wherein the mark comprises a first layer mark having a plurality first layer components, and a second layer mark having a plurality second layer components, wherein:
   the first layer mark and the second layer mark are adapted to be projected onto each other during the lithographic process,
   the first layer components and the second layer components are adapted to be arranged in a plurality of different overlay configurations, each overlay configuration comprising a number of the plurality of the first layer components and a number of the plurality of the second layer components, and each overlay configuration having a different overlay distance at which each first layer component is arranged in a first direction of an associated second layer component of the second layer components,
   wherein the method comprises the following steps:
   determining an overlay step which represents a difference between the different overlay distances of the plurality of overlay configurations,
   determining a largest overlay distance, and
   determining the number of first layer components and/or the number of associated second layer components in each overlay configuration.
2. Computer readable medium according to clause 1, wherein the step of determining the overlay step includes:
   determining a yield curve representing a theoretical steepest yield curve situation, wherein:
   i. the yield curve represents, for each overlay configuration and in function of the overlay distance, the percentage of second layer components of said overlay configuration which form a conductive path with the first layer component of said overlay configuration it is associated with,
   ii. the yield curve comprises at least a first lower level, a first higher level, and a first slope between the first lower level and the first higher level,
   iii. the theoretical steepest yield curve situation corresponds with the situation in which the first slope is the steepest,
   determining the overlay step such that, in theoretical steepest yield curve situation, the number of overlay configurations on the first slope is above a slope threshold.
3. Computer readable medium according to clause 2, wherein the theoretical steepest yield curve situation is determined in function of the possible materials of the first layer components and/or second layer components.

4. Computer readable medium according to any of the preceding clauses, wherein the step of determining the largest overlay distance includes:
    determining a yield curve representing a theoretical softest yield curve situation, wherein:
        i. the yield curve represents, for each overlay configuration and in function of the overlay distance, the percentage of second layer components of said overlay configuration which form a conductive path with the first layer component of said overlay configuration it is associated with,
        ii. the yield curve comprises at least a first lower level, a first higher level, and a first slope between the first lower level and the first higher level,
        iii. wherein the theoretical softest yield curve situation corresponds with the situation in which the first slope is the least steep,
    determining a largest slope overlay distance in the theoretical softest yield curve situation, wherein the largest slope overlay distance corresponds with the largest overlay distance on the first slope, and
    determining the largest overlay distance based on the largest slope overlay distance and a capture range deviation.
5. Computer readable medium according to any of the preceding clauses, the method further comprising a step of determining a smallest overlay distance.
6. Computer readable medium according to clause 5, wherein the step of determining the smallest overlay distance includes:
    determining a yield curve representing a theoretical softest yield curve situation, wherein:
        i. the yield curve represents, for each overlay configuration and in function of the overlay distance, the percentage of second layer components of said overlay configuration which form a conductive path with the first layer component of said overlay configuration it is associated with,
        ii. the yield curve comprises at least a first lower level, a first higher level, and a first slope between the first lower level and the first higher level,
        iii. wherein the theoretical softest yield curve situation corresponds with the situation in which the first slope is the least steep,
    determining a smallest slope overlay distance in the theoretical softest yield curve situation, wherein the smallest slope overlay distance corresponds with the smallest overlay distance on the first slope, and
    determining the smallest overlay distance based on the smallest slope overlay distance and a capture range deviation.
7. Computer readable medium according to clause 4 or clause 6, wherein the theoretical softest yield curve situation is determined in function of the possible materials of the first layer components and/or second layer components.
8. Computer readable medium according to any of the preceding clauses, wherein the number of first layer components and the number of associated second layer components in each overlay configuration are determined in function of a desired precision.
9. Method for designing a mark adapted to be projected onto an object during a lithographic process, wherein the mark comprises a first layer mark having a plurality first layer components, and a second layer mark having a plurality second layer components, wherein:
    the first layer mark and the second layer mark are adapted to be projected onto each other during the lithographic process,
    the first layer components and the second layer components are adapted to be arranged in a plurality of different overlay configurations, each overlay configuration comprising a number of the plurality of the first layer components and a number of the plurality of the second layer components, and each overlay configuration having a different overlay distance at which each first layer component is arranged in a first direction of an associated second layer component of the second layer components,
    wherein the method comprises the following steps:
    determining an overlay step which represents a difference between the different overlay distances of the plurality of overlay configurations,
    determining a largest overlay distance, and
    determining the number of first layer components and/or the number of associated second layer components in each overlay configuration.
10. Method according to clause 9, wherein the step of determining the overlay step includes:
    determining a yield curve representing a theoretical steepest yield curve situation, wherein:
        i. the yield curve represents, for each overlay configuration and in function of the overlay distance, the percentage of second layer components of said overlay configuration which form a conductive path with the first layer component of said overlay configuration it is associated with,
        ii. the yield curve comprises at least a first lower level, a first higher level, and a first slope between the first lower level and the first higher level,
        iii. the theoretical steepest yield curve situation corresponds with the situation in which the first slope is the steepest,
    determining the overlay step such that, in theoretical steepest yield curve situation, the number of overlay configurations on the first slope is above a slope threshold.
11. Method according to clause 10, wherein the theoretical steepest yield curve situation is determined in function of the possible materials of the first layer components and/or second layer components.
12. Method according to any of the clauses 9-11, wherein the step of determining the largest overlay distance includes:
    determining a yield curve representing a theoretical softest yield curve situation, wherein:
        i. the yield curve represents, for each overlay configuration and in function of the overlay distance, the percentage of second layer components of said overlay configuration which form a conductive path with the first layer component of said overlay configuration it is associated with,
        ii. the yield curve comprises at least a first lower level, a first higher level, and a first slope between the first lower level and the first higher level,
        iii. wherein the theoretical softest yield curve situation corresponds with the situation in which the first slope is the least steep,
    determining a largest slope overlay distance in the theoretical softest yield curve situation, wherein the largest slope overlay distance corresponds with the largest overlay distance on the first slope, and determining the largest overlay distance based on the largest slope overlay distance and a capture range deviation.
13. Method according to any of the clauses 9-12, further comprising a step of determining a smallest overlay distance.
14. Method according to clause 13, wherein the step of determining the smallest overlay distance includes:
determining a yield curve representing a theoretical softest yield curve situation, wherein:
   i. the yield curve represents, for each overlay configuration and in function of the overlay distance, the percentage of second layer components of said overlay configuration which form a conductive path with the first layer component of said overlay configuration it is associated with,
   ii. the yield curve comprises at least a first lower level, a first higher level, and a first slope between the first lower level and the first higher level,
   iii. wherein the theoretical softest yield curve situation corresponds with the situation in which the first slope is the least steep,
determining a smallest slope overlay distance in the theoretical softest yield curve situation, wherein the smallest slope overlay distance corresponds with the smallest overlay distance on the first slope, and
determining the smallest overlay distance based on the smallest slope overlay distance and a capture range deviation.
15. Method according to clause 12 or clause 14, wherein the theoretical softest yield curve situation is determined in function of the possible materials of the first layer components and/or second layer components.
16. Method according to any of the clauses 9-15, wherein the number of first layer components and the number of associated second layer components in each overlay configuration are determined in function of a desired precision.
17. Mark design, wherein the mark design is designed according to the method according to any of the clauses 9-16 and/or by executing the computer readable medium according to any of the clauses 1-8.
18. Mark adapted to be projected onto an object during a lithographic process, wherein:
the mark comprises a first layer mark having a plurality first layer components, and a second layer mark having a plurality second layer components, wherein:
the first layer mark and the second layer mark are adapted to be projected onto each other during the lithographic process,
the first layer components and the second layer components are adapted to be arranged in a plurality of different overlay configurations, each overlay configuration comprising a number of the plurality of the first layer components and a number of the plurality of the second layer components, and each overlay configuration having a different overlay distance at which each first layer component is arranged in a first direction of an associated second layer component of the second layer components, wherein the overlay distances:
are between a smallest overlay distance and a largest overlay distance, and
differ between the plurality of overlay configurations by an overlay step.
19. Mark according to clause 18, wherein the mark is adapted to be arranged on the object in a theoretical steepest yield curve situation, wherein the overlay step is such that the number of overlay configurations on a first slope of a yield curve in theoretical steepest yield curve situation is above a slope threshold.
20. Mark according to clause 18 or 19, wherein the mark is adapted to be arranged on the object in a theoretical softest yield curve situation, wherein the largest overlay distance corresponds with a combination of a largest slope overlay distance in the theoretical softest yield curve situation and a capture range deviation.
21. Mark according to any of the clauses 18-20, wherein the mark is adapted to be arranged on the object in a theoretical softest yield curve situation, wherein the smallest overlay distance corresponds with a combination of a smallest slope overlay distance in the theoretical softest yield curve situation and a capture range deviation.
22. Mark according to any of the clauses 18-21, wherein the number of first layer components and the number of associated second layer components in each overlay configuration are adapted to obtain a desired precision.
23. Object comprising a mark according to any of the clauses 18-22.
24. Reticle arrangement comprising one or more reticles, wherein the reticles comprise patterns adapted to be projected onto an object during a lithographic process, wherein the patterns comprise a mark pattern for projecting a mark onto the object, wherein the mark is a mark according to any of the clauses 18-22.
25. Apparatus comprising a processing unit, wherein the processing unit is adapted to perform the method according to any of the clauses 1-8.
26. Computer readable medium, comprising instructions adapted to, when executed on a processing unit, make the processing unit perform the method according to any of the clauses 9-16.
27. Method for projecting a pattern on an object during a lithographic process, wherein the method comprises projecting a mark onto the object, wherein the mark is designed according to the method according to any of the clauses 1-8 and/or wherein the mark is a mark according to any of the clauses 10-14.
28. Method for inspecting an object, wherein the object comprises a mark, wherein the mark is designed according to the method according to any of the clauses 9-16 and/or by executing the computer readable medium according to any of the clauses 1-8, and/or wherein the mark is a mark according to any of the clauses 18-22, wherein the method for inspecting comprises the following steps:
projecting an electron beam onto the mark,
determining a voltage contrast response for the second layer components,
determining a yield curve based on the voltage contrast responses, wherein the yield curve represents, for each overlay configuration and in function of the overlay distance, the percentage of second layer components of said overlay configuration which form a conductive path with the first layer component of said overlay configuration it is associated with.

The invention claimed is:
1. A non-transitory computer-readable medium that stores a set of instructions that is executable by a processing unit of a device to cause the device to perform operations for designing a mark to be fabricated on a substrate, the mark designed to have different overlay configurations for assessing a lithographic process, the operations comprising:
  determining an overlay step that represents a difference between different overlay distances of the different overlay configurations for a design of the mark, wherein:
    the mark comprises a first layer mark having a plurality of first layer components and a second layer mark having a plurality of second layer components,
    the first layer mark and the second layer mark are to be projected onto each other via the lithographic process,
    the first layer components and the second layer components are arranged according to the different overlay configurations,
    each overlay configuration of the different overlay configurations comprises a number of the plurality of the first layer components and a number of the plurality of the second layer components, and
    each overlay configuration of the different overlay configurations has a different overlay distance at which each first layer component is arranged in a first direction of an associated second layer component of the second layer components;
  determining a largest overlay distance of the different overlay distances; and
  determining the number of first layer components and/or the number of associated second layer components in each overlay configuration of the different overlay configurations.

2. The non-transitory computer-readable medium of claim 1, wherein determining the overlay step comprises:
  determining a yield curve representing a theoretical steepest yield curve situation, wherein:
    the yield curve represents, for each overlay configuration of the different overlay configurations and as a function of overlay distance, a percentage of the second layer components which form a conductive path with the first layer components,
    the yield curve comprises at least a first lower level, a first higher level, and a first slope between the first lower level and the first higher level,
    the theoretical steepest yield curve situation corresponds to the first slope being steepest; and
  determining the overlay step such that, in the theoretical steepest yield curve situation, a number of overlay configurations, of the different configurations, on the first slope is above a slope threshold.

3. The non-transitory computer-readable medium of claim 2, wherein the theoretical steepest yield curve situation is determined based on possible materials of the first layer components and/or the second layer components.

4. The non-transitory computer-readable medium according to claim 1, wherein determining the largest overlay distance comprises:
  determining a yield curve representing a theoretical softest yield curve situation, wherein:
    the yield curve represents, for each overlay configuration of the different overlay configurations and as a function of overlay distance, a percentage of the second layer components which form a conductive path with the first layer components,
    the yield curve comprises at least a first lower level, a first higher level, and a first slope between the first lower level and the first higher level,
    the theoretical softest yield curve situation corresponds to the first slope being least steep;
  determining a largest slope overlay distance in the theoretical softest yield curve situation, wherein the largest slope overlay distance corresponds with the largest overlay distance on the first slope; and
  determining the largest overlay distance based on the largest slope overlay distance and a capture range deviation.

5. The non-transitory computer-readable medium of claim 1, wherein the operations further comprise determining a smallest overlay distance of the different overlay distances.

6. The non-transitory computer-readable medium of claim 5, wherein determining the smallest overlay distance comprises:
  determining a yield curve representing a theoretical softest yield curve situation, wherein:
    the yield curve represents, for each overlay configuration of the different overlay configurations and as a function of overlay distance, a percentage of the second layer components which form a conductive path with the first layer components,
    the yield curve comprises at least a first lower level, a first higher level, and a first slope between the first lower level and the first higher level,
    the theoretical softest yield curve situation corresponds to the first slope being least steep;
  determining a smallest slope overlay distance in the theoretical softest yield curve situation, wherein the smallest slope overlay distance corresponds with the smallest overlay distance on the first slope; and
  determining the smallest overlay distance based on the smallest slope overlay distance and a capture range deviation.

7. The non-transitory computer-readable medium of claim 4, wherein the theoretical softest yield curve situation is determined based on possible materials of the first layer components and/or the second layer components.

8. The non-transitory computer-readable medium of claim 1, wherein the number of first layer components and the number of second layer components in each overlay configuration are determined based on a target precision for measurements of the mark.

9. A method for designing a mark to be fabricated on a substrate, the mark designed to have different overlay configurations for assessing a lithographic process, the method comprising:
  determining an overlay step which represents a difference between different overlay distances of the different overlay configurations for a design of the mark, wherein:
    the mark comprises a first layer mark having a plurality of first layer components and a second layer mark having a plurality of second layer components,
    the first layer mark and the second layer mark are to be projected onto each other during the lithographic process,
    the first layer components and the second layer components are arranged according to the different overlay configurations,
    each overlay configuration of the different overlay configurations comprises a number of the plurality of the first layer components and a number of the plurality of the second layer components, and
    each overlay configuration of the different overlay configurations has a different overlay distance at which each first layer component is arranged in a first direction of an associated second layer component of the second layer components;

determining a largest overlay distance of the different overlay distances; and determining the number of first layer components and/or the number of associated second layer components in each overlay configuration of the different overlay configurations.

10. A mark for assessing a quality of a lithographic process, comprising:

overlapping layers comprising:

a first layer mark having a plurality of first layer components; and a second layer mark having a plurality second layer components, wherein:

the first layer components and the second layer components are arranged according to different overlay configurations having different overlay distances, each overlay configuration of the different overlay configurations comprises a number of the plurality of the first layer components and a number of the plurality of the second layer components, each overlay configuration of the different overlay configurations has a different overlay distance at which each first layer component is arranged in a first direction of an associated second layer component of the second layer components, the different overlay distances are between a smallest overlay distance and a largest overlay distance, and the different overlay distances differ between the different overlay configurations by an overlay step.

11. A substrate comprising the mark of claim 10.

12. A reticle arrangement comprising a pattern of the mark of claim 10, wherein:

the reticle arrangement comprises one or more reticles, and the one or more reticles configured to project the pattern of the mark onto a substrate via a lithographic process.

13. An apparatus comprising:

the non-transitory computer readable medium of claim 1; and a processing unit, wherein the processing unit is configured to perform the operations caused by the set of instructions stored in the non-transitory computer-readable medium.

14. A method comprising:

projecting a pattern of a mark onto a substrate, wherein the mark is designed according to the according to the operations associated with the set of instructions stored in the non-transitory computer readable medium of claim 1.

15. A method for inspecting the substrate of claim 11, the method comprising:

projecting an electron beam onto the mark of the substrate;

determining a voltage contrast response for the second layer components, determining a yield curve based on the voltage contrast responses, wherein:

the yield curve represents, for each overlay configuration of the different overlay configurations and as a function of overlay distance, a percentage of the second layer components which form a conductive path with the first layer components.

16. The non-transitory computer-readable medium of claim 6, wherein the theoretical softest yield curve situation is determined based on possible materials of the first layer components and/or the second layer components.

* * * * *